United States Patent
Fudaba et al.

(10) Patent No.: US 9,263,994 B2
(45) Date of Patent: Feb. 16, 2016

(54) AMPLIFYING DEVICE, DISTORTION COMPENSATING DEVICE, AND AMPLIFYING METHOD

(71) Applicant: FUJITSU LIMITED, Kawasaki-shi, Kanagawa (JP)

(72) Inventors: Nobukazu Fudaba, Yokohama (JP); Hiroyoshi Ishikawa, Yokohama (JP); Yuichi Utsunomiya, Kawasaki (JP); Toshio Kawasaki, Kawasaki (JP); Kazuo Nagatani, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/156,203

(22) Filed: Jan. 15, 2014

(65) Prior Publication Data

US 2014/0197885 A1    Jul. 17, 2014

(30) Foreign Application Priority Data

Jan. 17, 2013    (JP) .................................. 2013-006657

(51) Int. Cl.
*H03F 1/32*    (2006.01)

(52) U.S. Cl.
CPC ...... *H03F 1/3247* (2013.01); *H03F 2201/3221* (2013.01)

(58) Field of Classification Search
USPC ..................... 330/149, 310, 98–99; 455/114.3
See application file for complete search history.

(56) References Cited

U.S. PATENT DOCUMENTS

| | | | |
|---|---|---|---|
| 6,246,286 B1 * | 6/2001 | Persson .......................... | 330/149 |
| 8,013,676 B2 * | 9/2011 | Su et al. ........................ | 330/149 |
| 2005/0077960 A1 | 4/2005 | Kim et al. | |

FOREIGN PATENT DOCUMENTS

| | | |
|---|---|---|
| JP | 2002-300223 A | 10/2002 |
| JP | 2005-117613 A | 4/2005 |
| JP | 2006-279633 A | 10/2006 |

* cited by examiner

*Primary Examiner* — Hieu Nguyen
(74) *Attorney, Agent, or Firm* — Arent Fox LLP

(57) ABSTRACT

An amplifying device including: a first amplifier configured to generate a first output signal by amplifying an input signal, a second amplifier configured to generate a second output signal by amplifying the first output signal, and a processor configured to perform a first compensation by compensating a distortion for the second amplifier in accordance with the first output signal and the second output signal.

17 Claims, 17 Drawing Sheets

AMPLIFYING DEVICE, DISTORTION COMPENSATING DEVICE, AND AMPLIFYING METHOD

CROSS-REFERENCE TO RELATED APPLICATION

This application is based upon and claims the benefit of priority of the prior Japanese Patent Application No. 2013-006657, filed on Jan. 17, 2013, the entire contents of which are incorporated herein by reference.

FIELD

The embodiments discussed herein are related to an amplifying device, a distortion compensating device, and an amplifying method.

BACKGROUND

For example, from the viewpoint of power conversion efficiency, a transmission unit such as a base station in a mobile communication system may be designed to operate in a nonlinear region where back-off from saturation power is small. Thus, when a modulating signal for high-speed wireless communication is inputted, out-of-band radiation due to nonlinear distortion occurs, thereby affecting adjacent transmission channels.

Distortion compensation technology for reducing such out-of-band radiation caused by a transmission amplifier includes predistortion (PD) compensation in which the reverse characteristic of the transmission amplifier is added in advance to transmission signals. In the predistortion compensation, a distortion compensation coefficient is adaptively updated so as to reduce the difference between a transmission signal and a signal obtained by feeding back part the output signal of the transmission amplifier. In addition, digital predistortion is known in which predistortion is performed in a digital region.

A transmission amplifier such as a base station may be implemented by multi-stage connection of a plurality of amplifiers. When the transmission amplifier having such a multi-stage structure is operated with high power conversion efficiency, nonlinear distortion occurs also in an amplifier other than the final stage amplifier, and thus a signal distorted in a former stage amplifier (for example, a driver stage amplifier) is inputted to the final stage amplifier, thereby causing complicated nonlinear distortion in the final stage amplifier. For this problem, a distortion compensation circuit is known in which a predistortion compensation unit for compensating the former stage amplifier, and a predistortion compensation unit for compensating the final stage amplifier are connected in cascade (for example, see Japanese Laid-Open Patent Publication No. 2006-279633).

SUMMARY

According to an aspect of the invention, an amplifying device includes a first amplifier configured to generate a first output signal by amplifying an input signal, a second amplifier configured to generate a second output signal by amplifying the first output signal, and a processor configured to perform a first compensation by compensating a distortion for the second amplifier in accordance with the first output signal and the second output signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

With the above-described conventional technology, however, when distortion remains at the output of the former stage amplifier due to e.g. a change in the input signal for example, the characteristic of a signal changes which is fed back to the predistortion compensation unit corresponding to the latter stage amplifier, and thus distortion compensation of the latter stage amplifier may not be performed with high accuracy.

In order to solve the problem of the above-described conventional technology, the present disclosure provides an amplifying device, a distortion compensating device, and a distortion compensation method that allow distortion compensation accuracy to be improved.

Hereinafter, an embodiment of an amplifying device, a distortion compensating device, and a distortion compensation method according to the present disclosure will be described in detail with reference to the accompanying drawings.

First Embodiment

Configuration of Amplifying Device According to First Embodiment

Figure 1:
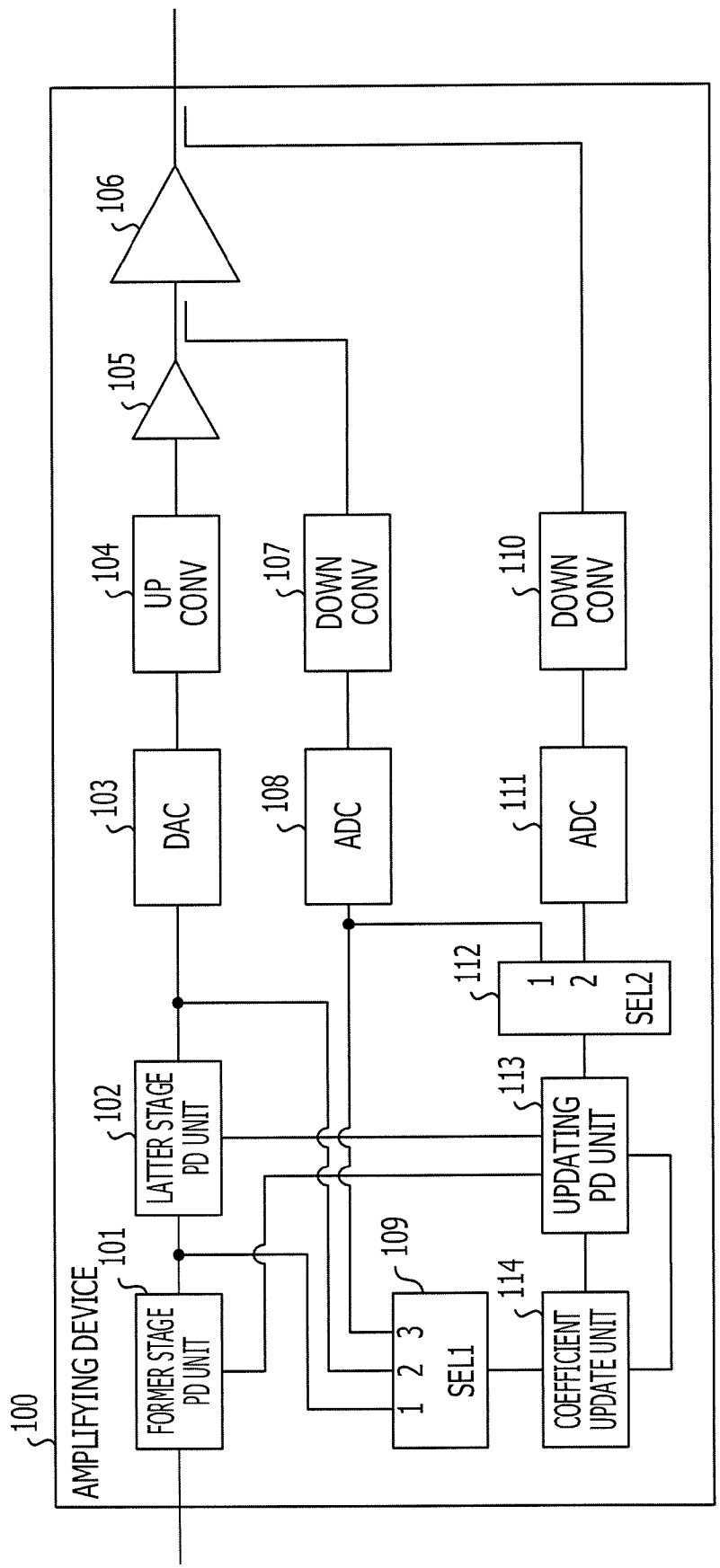
FIG. 1 is a diagram illustrating an example of a configuration of an amplifying device according to a first embodiment.
Figure 2:
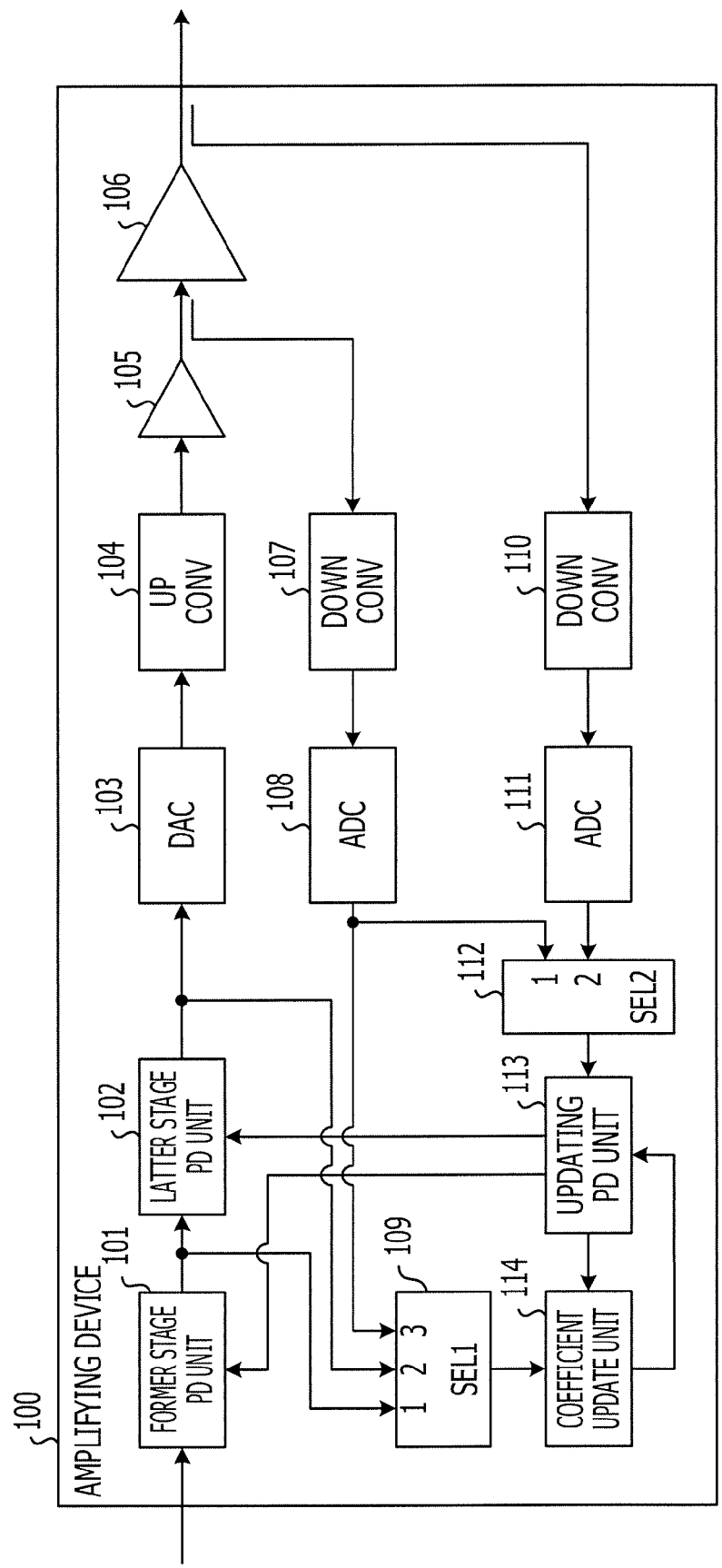
FIG. 2 is a diagram illustrating an example of a signal flow in the amplifying device illustrated in FIG. 1.

FIG. 1 is a diagram illustrating an example of a configuration of an amplifying device according to a first embodiment. FIG. 2 is a diagram illustrating an example of a signal flow in the amplifying device illustrated in FIG. 1. An amplifying device 100 according to the first embodiment is an amplifying device that amplifies an input signal and outputs the amplified signal. For example, the amplifying device 100 may be applied to an amplifying device to amplify a signal to be transmitted in a transmitter to transmit a signal such as a radio signal.

As illustrated in FIGS. 1 and 2, the amplifying device 100 includes a former stage PD unit 101, a latter stage PD unit 102, a digital/analog converter (DAC) 103, an up converter 104 (Up Cony), a driver stage amplifier 105, a final stage amplifier 106, a down converter 107 (Down Cony), an analog/digital converter (ADC) 108, a selector 109 (SEL1), a down converter 110 (Down Cony), an ADC 111, a selector 112 (SEL2), a updating PD unit 113, and a coefficient update unit 114.

A signal inputted to the amplifying device 100 is inputted to the former stage PD unit 101. The signal inputted to the former stage PD unit 101 is, for example, a digital electrical signal at the baseband frequency. The former stage PD unit 101 performs predistortion to provide the input signal with the reverse characteristic of nonlinear distortion which occurs in the signal in the final stage amplifier 106. Thus, the nonlinear distortion which occurs in the signal in the final stage amplifier 106 may be compensated. The reverse characteristic with which the former stage PD unit 101 provides the input signal is controlled by the coefficient which is set to the former stage PD unit 101. The former stage PD unit 101 outputs the signal having the reverse characteristic to the latter stage PD unit 102 and the selector 109.

The latter stage PD unit 102 performs predistortion to provide the signal outputted from the former stage PD unit 101 with the reverse characteristic of nonlinear distortion which occurs in the signal in the driver stage amplifier 105. Thus, the nonlinear distortion which occurs in the signal in the driver stage amplifier 105 may be compensated. The reverse characteristic with which the latter stage PD unit 102 provides the output signal is controlled by the coefficient which is set to the latter stage PD unit 102. The latter stage PD unit 102 outputs the signal having the reverse characteristic to the DAC 103 and the selector 109.

The DAC 103 converts an output signal from a digital form to an analog form, and outputs the converted signal to the up converter 104, the output signal being outputted from the latter stage PD unit 102. The up converter 104 converts the signal outputted from the DAC 103 to a radio frequency signal, and outputs the converted signal to the driver stage amplifier 105.

The driver stage amplifier 105 amplifies the signal outputted from the up converter 104, and outputs the amplified signal to the final stage amplifier 106. The final stage amplifier 106 amplifies the signal outputted from the driver stage amplifier 105, and outputs the amplified signal.

Part of the signal outputted from the driver stage amplifier 105 to the final stage amplifier 106 is fed back and inputted to the down converter 107. The down converter 107 converts the frequency of the inputted signal, and outputs the converted signal to the ADC 108. The ADC 108 converts an output signal from an analog form to a digital form, and outputs the converted signal to the selector 109 and the selector 112, the output signal being outputted from the down converter 107.

A signal (1) outputted from the former stage PD unit 101, a signal (2) outputted from the latter stage PD unit 102, and a signal (3) outputted from the ADC 108 are inputted to the selector 109. The selector 109 selects one of the inputted signals, and outputs the one as a reference signal to the coefficient update unit 114. The signal switching with the selector 109 is performed, for example, by a control circuit (not illustrated) of the amplifying device 100.

Part of the signal outputted from the final stage amplifier 106 is fed back and inputted to the down converter 110. The down converter 110 converts the frequency of the inputted signal, and outputs the converted signal to the ADC 111. The ADC 111 converts an output signal from an analog form to a digital form, and outputs the converted signal to the selector 112, the output signal being outputted from the down converter 110.

A signal (1) outputted from the ADC 108 and a signal (2) outputted from the ADC 111 are inputted to the selector 112. The selector 112 selects one of the inputted signals, and outputs the one as a feedback signal to the updating PD unit 113. The signal switching with the selector 112 is performed, for example, by a control circuit (not illustrated) of the amplifying device 100.

The updating PD unit 113 performs predistortion for imparting a characteristic according to the set coefficient to the signal which has been outputted as a feedback signal from the selector 112. The coefficient set to the updating PD unit 113 is updated by the coefficient update unit 114. The updating PD unit 113 outputs the signal having the characteristic to the coefficient update unit 114. When the update by the coefficient update unit 114 is completed, the coefficient set to the updating PD unit 113 is copied to the former stage PD unit 101 or the latter stage PD unit 102. The copy of the coefficient to the former stage PD unit 101 or the latter stage PD unit 102 is made, for example, by a control circuit (not illustrated) of the amplifying device 100, the coefficient being set to the updating PD unit 113.

The coefficient update unit 114 updates the coefficient of predistortion in the updating PD unit 113 based on the difference between the signal outputted as a reference signal from the selector 109 and the signal outputted from the updating PD unit 113. For example, the coefficient update unit 114 updates the coefficient of predistortion in the updating PD unit 113 so as to reduce the difference between the signal outputted from the selector 109 and the signal outputted from the updating PD unit 113.

In this manner, the amplifying device 100 has an indirect learning distortion compensation circuit including the updating PD unit 113 in a feedback system, the updating PD unit 113 being similar to the former stage PD unit 101 and the latter stage PD unit 102 in a feed-forward system.

A distortion compensating device may be achieved by excluding the driver stage amplifier 105 and the final stage amplifier 106 from the amplifying device 100. In this case, predistortion of the driver stage amplifier 105 and the final stage amplifier 106 may be performed by coupling the distortion compensating device to the driver stage amplifier 105 and the final stage amplifier 106.

(Signal Flow when Coefficient of Latter Stage PD Unit is Set)

Figure 3:
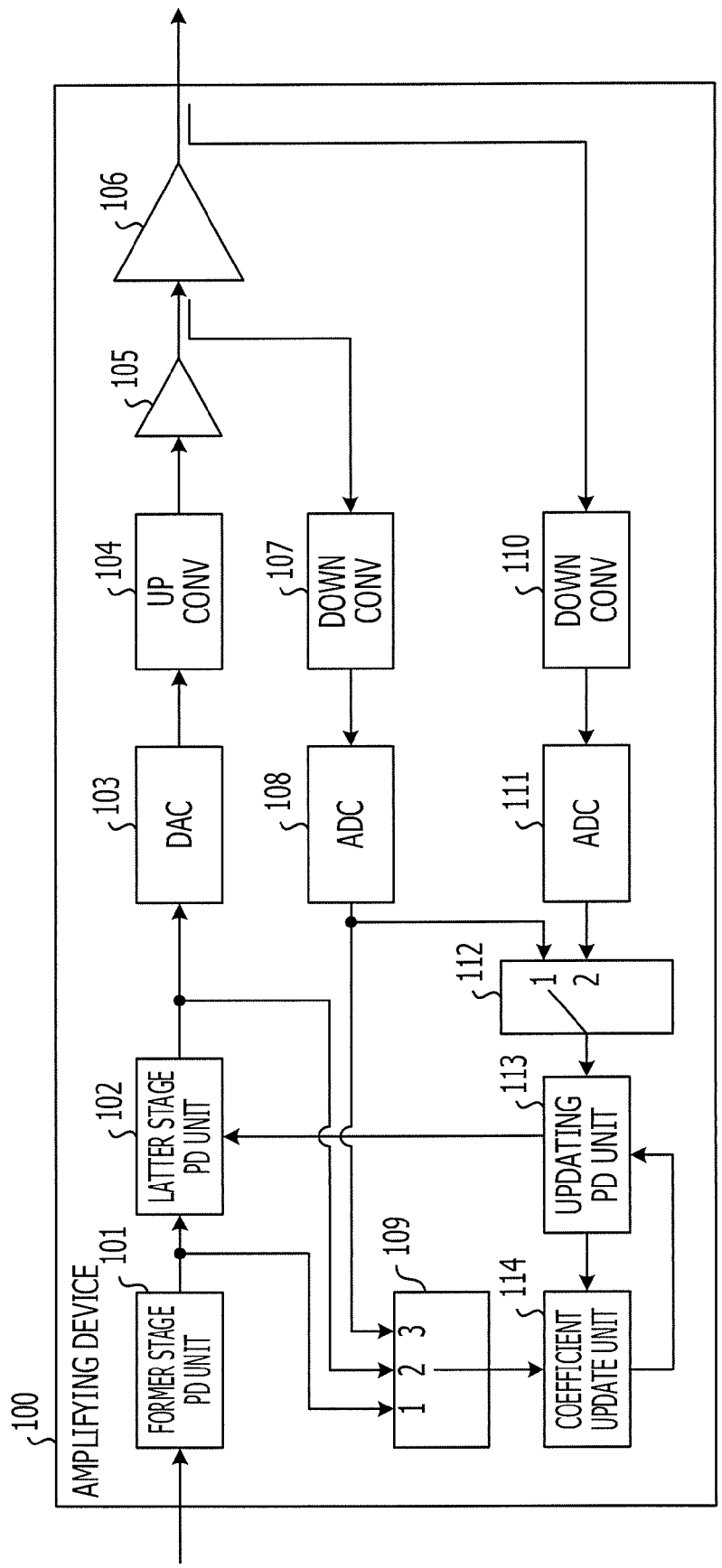
FIG. 3 is a diagram illustrating an example of a signal flow when a coefficient of a latter stage PD unit is set.

FIG. 3 is a diagram illustrating an example of a signal flow when the coefficient of the latter stage PD unit is set. In FIG. 3, a portion similar to that illustrated in FIGS. 1 and 2 is labeled with the same symbol, and description is omitted. When the coefficient of the latter stage PD unit 102 is updated, the control circuit of the amplifying device 100 sets the input of the selector 109 to "2" as illustrated in FIG. 3, thereby outputting the signal from the latter stage PD unit 102 as a reference signal to the coefficient update unit 114. In addition, the control circuit of the amplifying device 100 sets the input of the selector 112 to "1", thereby outputting the signal outputted from the ADC 108 as a feedback signal to the updating PD unit 113.

In this manner, by using the signal outputted from the latter stage PD unit 102 as a reference signal and the signal outputted from the driver stage amplifier 105 as a feedback signal, the coefficient of the updating PD unit 113 may be updated by the coefficient update unit 114. When the coefficient of the updating PD unit 113 is updated, the control circuit of the amplifying device 100 copies the updated coefficient of the updating PD unit 113 to the latter stage PD unit 102. In this manner, the coefficient updated by using the signal outputted from the latter stage PD unit 102 as a reference signal and the signal outputted from the driver stage amplifier 105 as a feedback signal may be set to the latter stage PD unit 102.

(Signal Flow when Coefficient of Former Stage PD Unit is Set)

Figure 4:
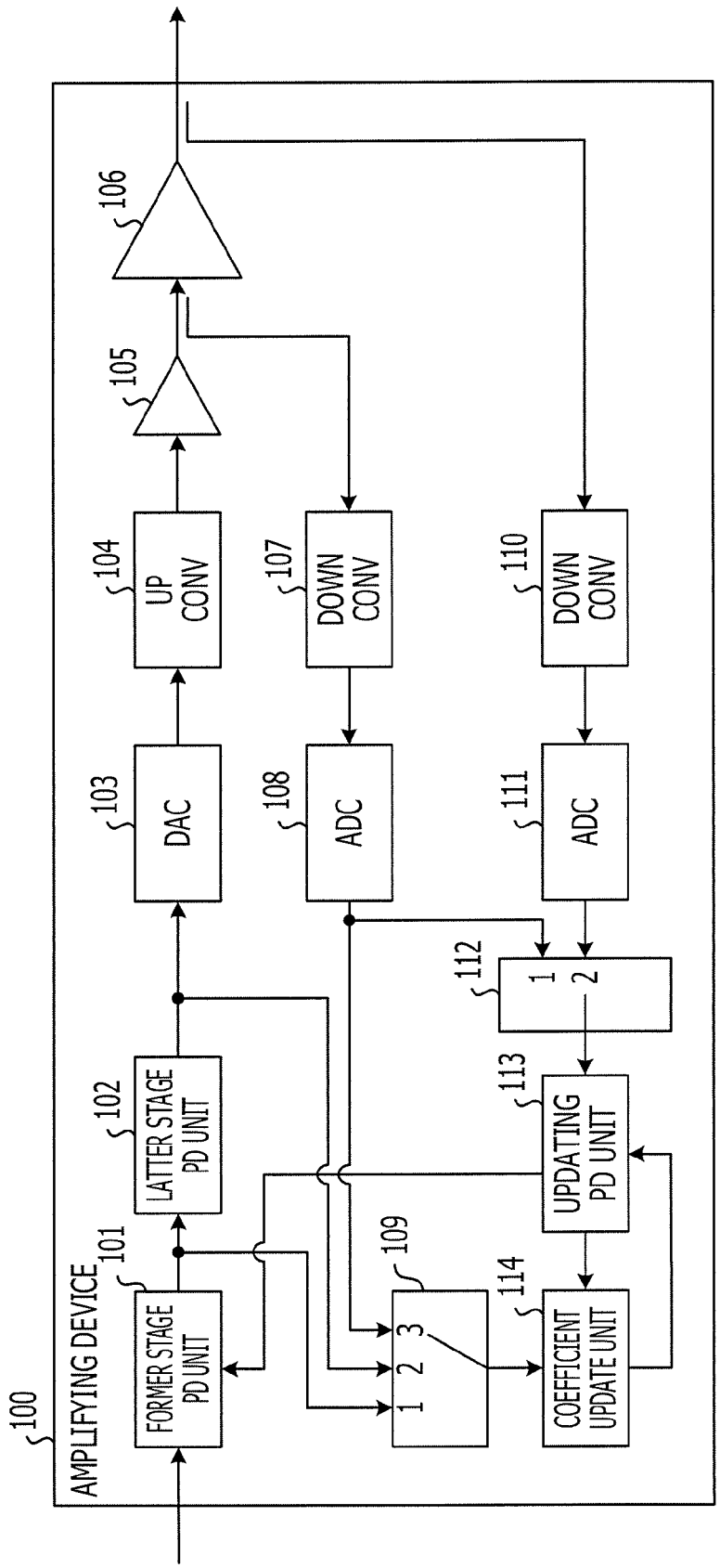
FIG. 4 is a diagram illustrating an example of a signal flow when a coefficient of a former stage PD unit is set.

FIG. 4 is a diagram illustrating an example of a signal flow when the coefficient of the former stage PD unit is set. In FIG. 4, a portion similar to that illustrated in FIGS. 1 and 2 is labeled with the same symbol, and description is omitted. When the coefficient of the former stage PD unit 101 is updated, the control circuit of the amplifying device 100 sets the input of the selector 109 to "3" as illustrated in FIG. 4, thereby outputting the signal from the ADC 108 as a reference signal to the coefficient update unit 114. In addition, the control circuit of the amplifying device 100 sets the input of the selector 112 to "2", thereby outputting the signal outputted from the ADC 111 as a feedback signal to the updating PD unit 113.

In this manner, by using the signal outputted from the driver stage amplifier 105 as a reference signal and the signal outputted from the final stage amplifier 106 as a feedback signal, the coefficient of the updating PD unit 113 may be updated by the coefficient update unit 114. When the coefficient of the updating PD unit 113 is updated, the control circuit of the amplifying device 100 copies the updated coefficient of the updating PD unit 113 to the former stage PD unit 101. In this manner, the updated coefficient may be set to the former stage PD unit 101, the updated coefficient being obtained by using the signal outputted from the driver stage amplifier 105 as a reference signal and the signal outputted from the final stage amplifier 106 as a feedback signal.

Consequently, the coefficient of the updating PD unit 113 may be updated by using the input signal and the output signal of the final stage amplifier 106, thus the coefficient of the former stage PD unit 101 may be set without any influence of residual distortion in the driver stage amplifier 105.

Figure 5:
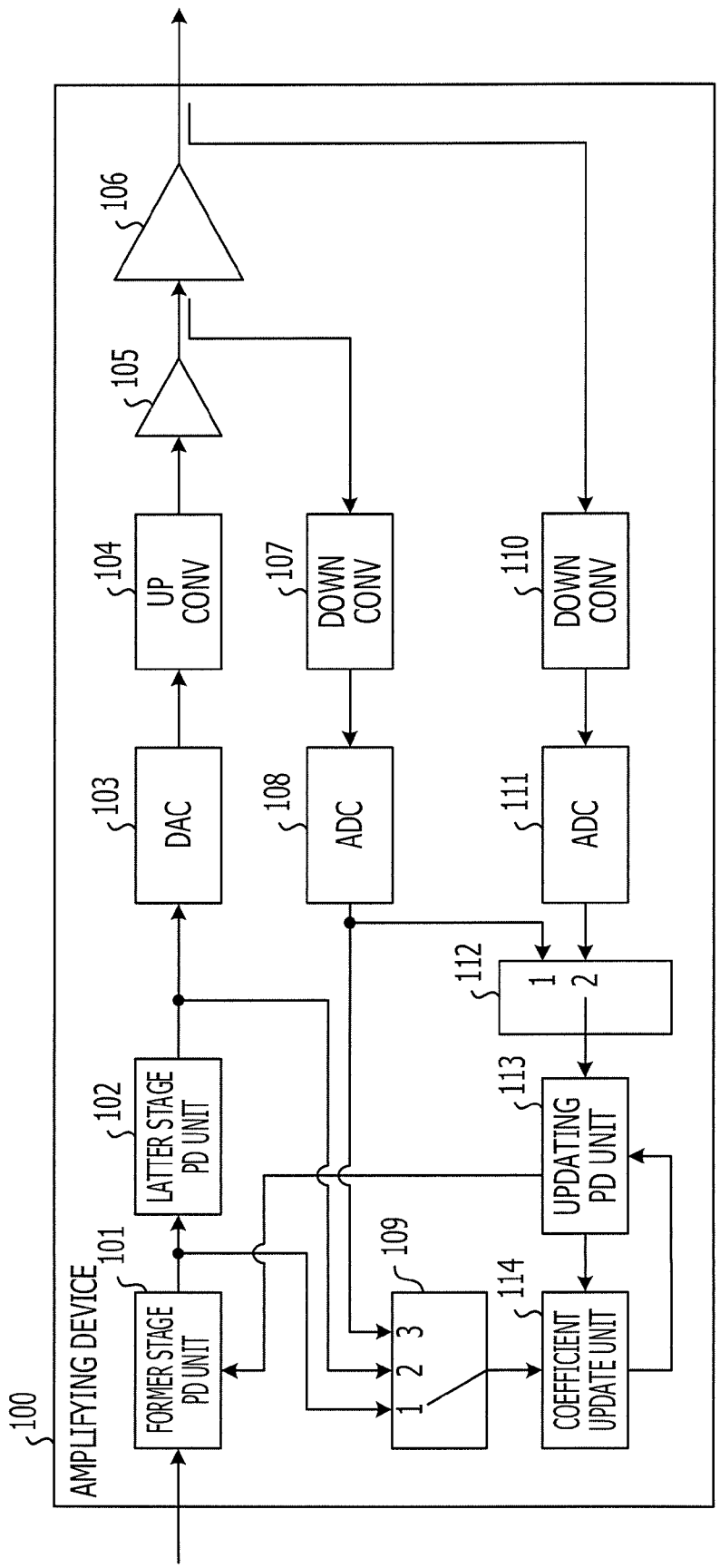
FIG. 5 is a diagram illustrating another example of a signal flow when a coefficient of the former stage PD unit is set.

FIG. 5 is a diagram illustrating another example of a signal flow when the coefficient of the former stage PD unit is set. In FIG. 5, a portion similar to that illustrated in FIGS. 1 and 2 is labeled with the same symbol, and description is omitted. When the coefficient of the former stage PD unit 101 is updated with a small amount of the residual distortion of the driver stage amplifier 105, updating the coefficient is not affected so much even if the update loop of the former stage PD unit 101 includes the latter stage PD unit 102 and the driver stage amplifier 105.

For this reason, in this case, the control circuit of the amplifying device 100 may set the input of the selector 109 to "1" as illustrated in FIG. 5 so as to output the signal from the former stage PD unit 101 as a reference signal to the coefficient update unit 114. Also in this case, the control circuit of the amplifying device 100 sets the input of the selector 112 to "2", thereby outputting the signal outputted from the ADC 111 as a feedback signal to the updating PD unit 113.

In this manner, the digital output signal of the former stage PD unit 101 may be used as a reference signal, thus the coefficient update may be made with increased accuracy.

(Coefficient Setting Operation by Amplifying Device)

Figure 6:
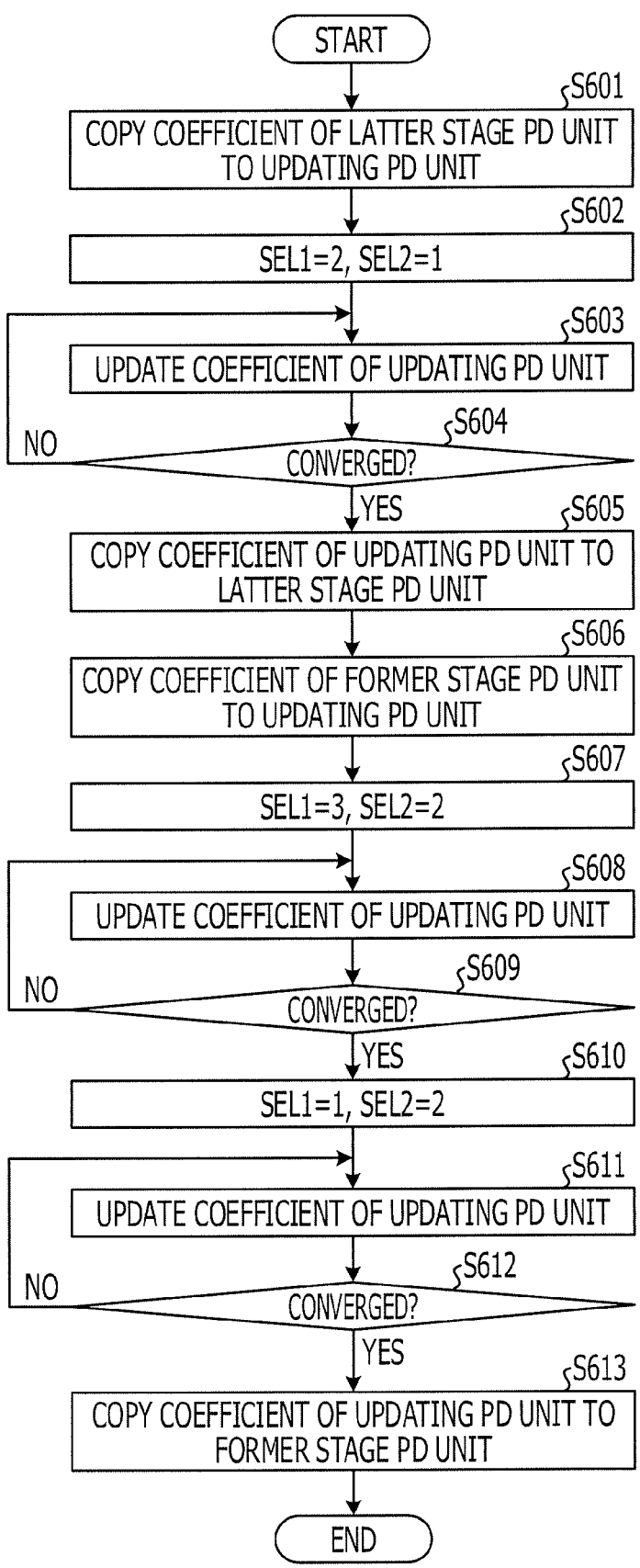
FIG. 6 is a flow chart illustrating an example of a coefficient setting operation performed by the amplifying device.

FIG. 6 is a flow chart illustrating an example of a coefficient setting operation performed by the amplifying device. The amplifying device 100 performs, for example, the following operations as a coefficient setting operation for the former stage PD unit 101 and the latter stage PD unit 102. Each of the following operations is performed, for example, by a control circuit (not illustrated) of the amplifying device 100.

S601 to S605 correspond to the coefficient setting operation for the latter stage PD unit 102, which has been described with reference to FIG. 3. First, the amplifying device 100 copies the coefficient set in the latter stage PD unit 102 to the updating PD unit 113 (S601). Next, the amplifying device 100 sets the input of the selector 109 (SEL1) to "2" and sets the input of the selector 112 (SEL2) to "1" (S602).

Next, the amplifying device 100 updates the coefficient of the updating PD unit 113 by the coefficient update unit 114 (S603). Next, the amplifying device 100 determines whether or not the coefficient of the updating PD unit 113 has converged by the update in S603 (S604). When the coefficient has not converged (No in S604), the operational flow of the amplifying device 100 returns to S603.

In S604, when the coefficient has converged (Yes in S604), the amplifying device 100 copies the coefficient of the updating PD unit 113 to the latter stage PD unit 102 (S605). Thus, the amplifying device 100 completes the coefficient setting operation for the latter stage PD unit 102, and the operational flow proceeds to the coefficient setting operation for the former stage PD unit 101.

S606 to S609 correspond to the coefficient setting operation for the former stage PD unit 101, which has been described with reference to FIG. 4. First, the amplifying device 100 copies the coefficient set in the former stage PD unit 101 to the updating PD unit 113 (S606). Next, the amplifying device 100 sets the input of the selector 109 (SEL1) to "3" and sets the input of the selector 112 (SEL2) to "2" (S607).

Next, the amplifying device 100 updates the coefficient of the updating PD unit 113 by the coefficient update unit 114 (S608). Next, the amplifying device 100 determines whether or not the coefficient of the updating PD unit 113 has converged by the update in S608 (S609). When the coefficient has not converged (No in S609), the operational flow of the amplifying device 100 returns to S608.

In S609, when the coefficient has converged (Yes in S609), the amplifying device 100 completes the coefficient setting operation for the former stage PD unit 101, which has been described with reference to FIG. 4, and proceeds to the coefficient setting operation for the former stage PD unit 101, which has been described with reference to FIG. 5. In the example illustrated in FIG. 6, the coefficient of the updating PD unit 113 that has converged in S609 is not copied to the former stage PD unit 101. However, the coefficient of the updating PD unit 113 that has converged in S609 may be copied to the former stage PD unit 101.

S610 to S613 correspond to the coefficient setting operation for the former stage PD unit 101, which has been described with reference to FIG. 5. First, the amplifying device 100 sets the input of the selector 109 (SEL1) to "1" and sets the input of the selector 112 (SEL2) to "2" (S610).

Next, the amplifying device 100 updates the coefficient of the updating PD unit 113 by the coefficient update unit 114 (S611). Next, the amplifying device 100 determines whether or not the coefficient of the updating PD unit 113 has converged by the update in S611 (S612). When the coefficient has not converged (No in S612), the operational flow of the amplifying device 100 returns to S611.

In S612, when the coefficient has converged (Yes in S612), the amplifying device 100 copies the coefficient of the updating PD unit 113 to the former stage PD unit 101 (S613). Thus, the amplifying device 100 completes the coefficient setting operation for the former stage PD unit 101, which has been described with reference to FIG. 5, and terminates a series of the coefficient setting operations.

(Hardware Configuration of Amplifying Device)

Figure 7:
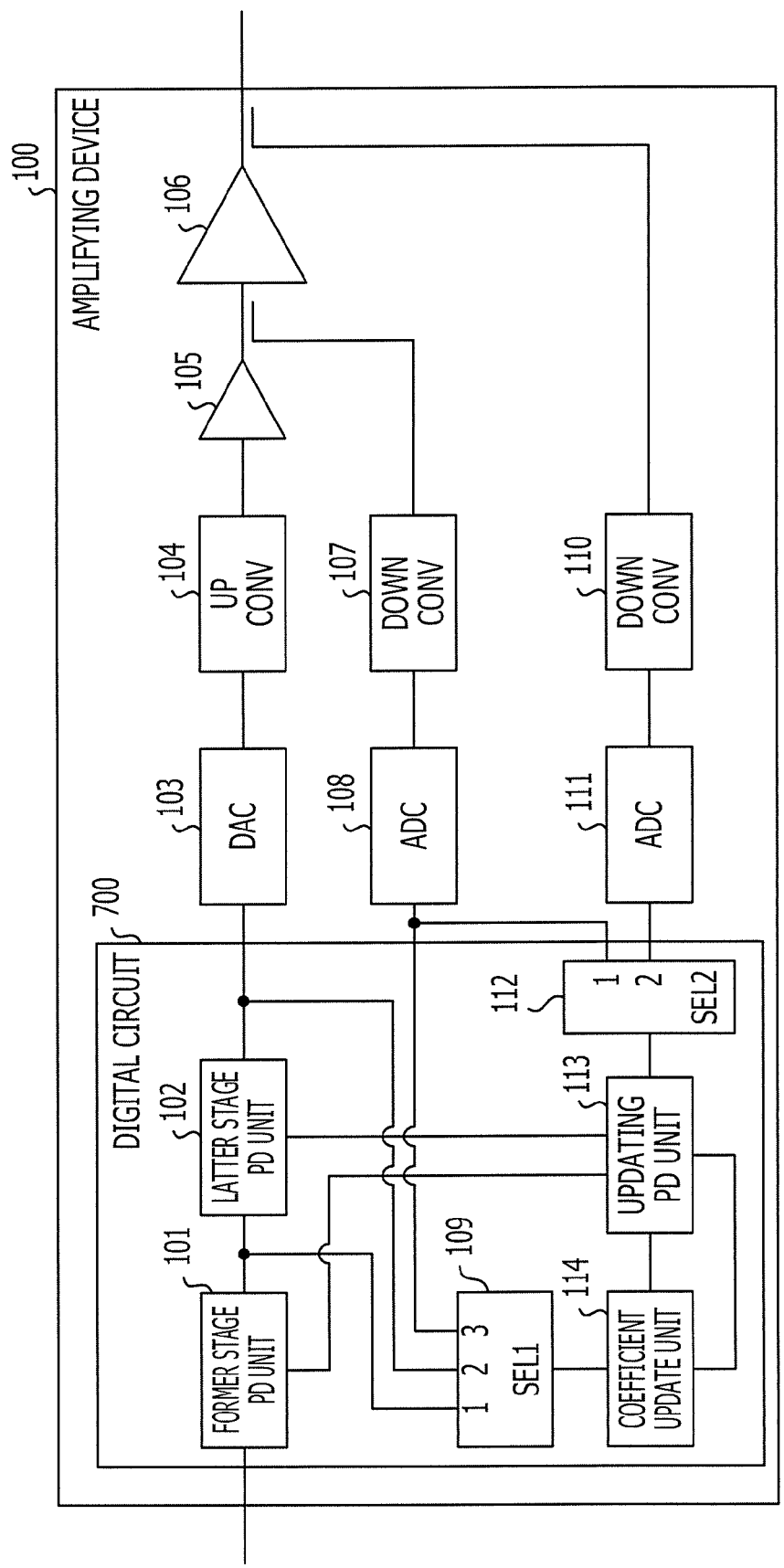
FIG. 7 is a diagram illustrating an example of a hardware configuration of the amplifying device.

FIG. 7 is a diagram illustrating an example of a hardware configuration of the amplifying device. In FIG. 7, a portion similar to that illustrated in FIG. 1 is labeled with the same symbol, and description is omitted. As illustrated in FIG. 7, the former stage PD unit 101, the latter stage PD unit 102, the selector 109, the selector 112, the updating PD unit 113, and the coefficient update unit 114 of the amplifying device 100 may be implemented, for example, by a digital circuit 700.

The above-mentioned control circuit of the amplifying device 100 may be also implemented by the digital circuit 700. In the digital circuit 700, various types of digital circuits may be used, such as a field programmable gate array (FPGA) or a digital signal processor (DSP).

Although a case has been described where digital predistortion is performed using the digital circuit 700 in the former stage PD unit 101 and the latter stage PD unit 102, at least part of the digital circuit 700 may be replaced by an analog circuit.

In this manner, with the amplifying device 100 according to the first embodiment, the coefficient (a first coefficient) of the former stage PD unit 101 (a first compensation unit) may be set based on the difference between the signal inputted to the final stage amplifier 106 (a second amplifier) and the signal outputted from the final stage amplifier 106. Consequently, the coefficient of the former stage PD unit 101 may be set without any influence of the residual distortion in the driver stage amplifier 105 (a first amplifier), thus accuracy of distortion compensation may be improved.

Second Embodiment

Configuration of Amplifying Device According to Second Embodiment

Figure 8:
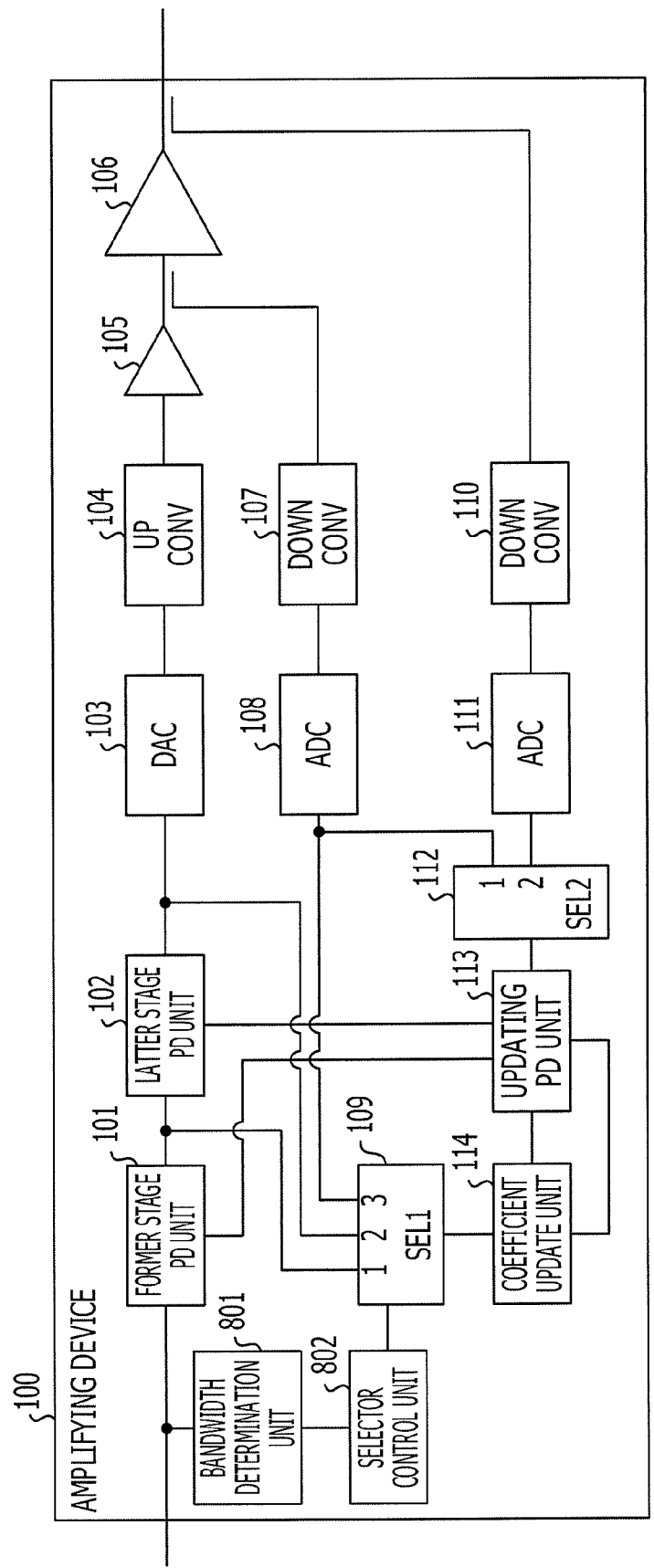
FIG. 8 is a diagram illustrating an example of a configuration of an amplifying device according to a second embodiment.
Figure 9:
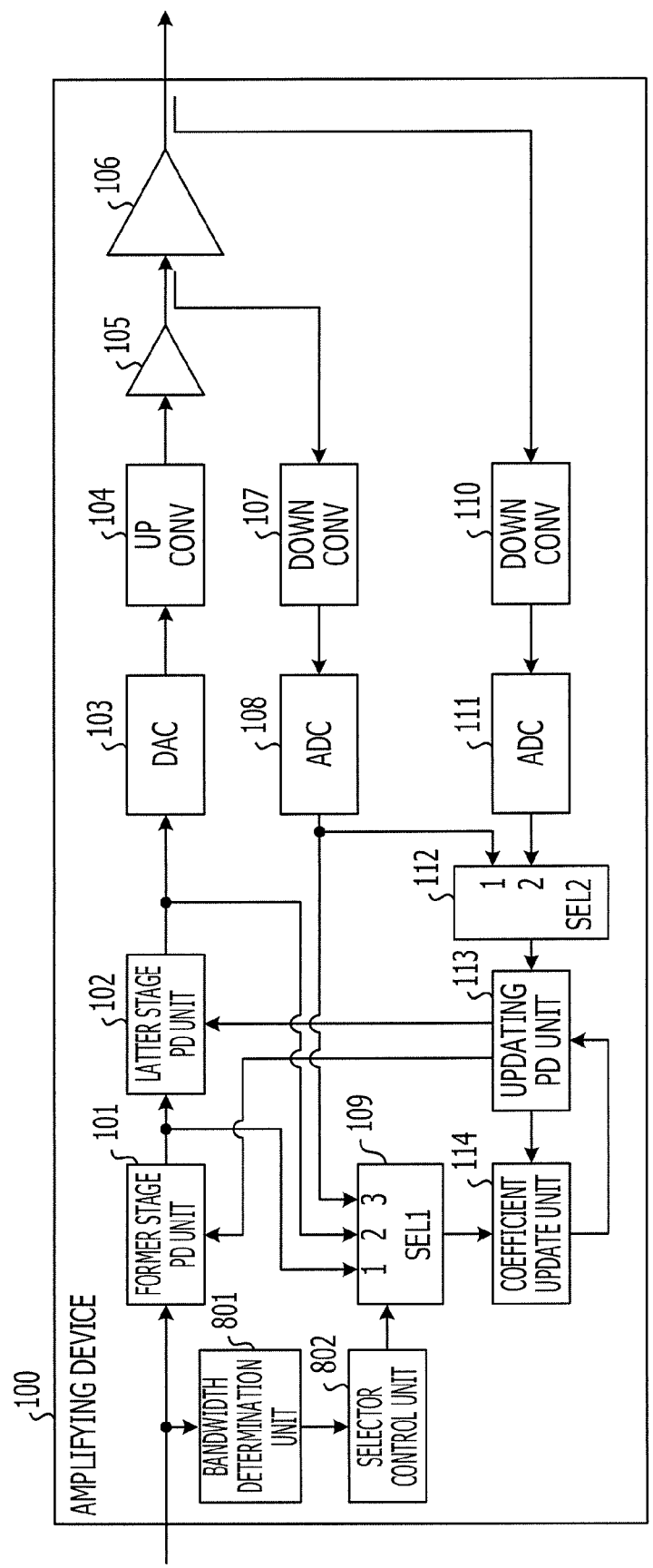
FIG. 9 is a diagram illustrating an example of a signal flow in the amplifying device illustrated in FIG. 8.

FIG. 8 is a diagram illustrating an example of a configuration of an amplifying device according to a second embodiment. FIG. 9 is a diagram illustrating an example of a signal flow in the amplifying device illustrated in FIG. 8. In FIGS. 8 and 9, a portion similar to that illustrated in FIGS. 1 and 2 is labeled with the same symbol, and description is omitted.

As illustrated in FIGS. 8 and 9, the amplifying device 100 according to the second embodiment includes a bandwidth determination unit 801 and a selector control unit 802 in addition to the configuration illustrated in FIGS. 1 and 2. The bandwidth determination unit 801 and the selector control unit 802 may be implemented, for example, by the digital circuit 700 illustrated in FIG. 7.

The bandwidth determination unit 801 and the selector control unit 802 are detection units which detect a change in the characteristic of the input signal to the amplifying device 100. The bandwidth determination unit 801 determines the bandwidth (for example, the bandwidth of frequency) of the input signal to the amplifying device 100. For example, the bandwidth determination unit 801 determines the bandwidth by performing Fast Fourier Transform (FFT) on the input signal to the amplifying device 100. Optionally, the bandwidth determination unit 801 may determine a bandwidth based on the information from a higher level device (for example, transmitting device) of the amplifying device 100. The bandwidth determination unit 801 then outputs bandwidth information, which indicates the determined bandwidth, to the selector control unit 802.

Figure 10:
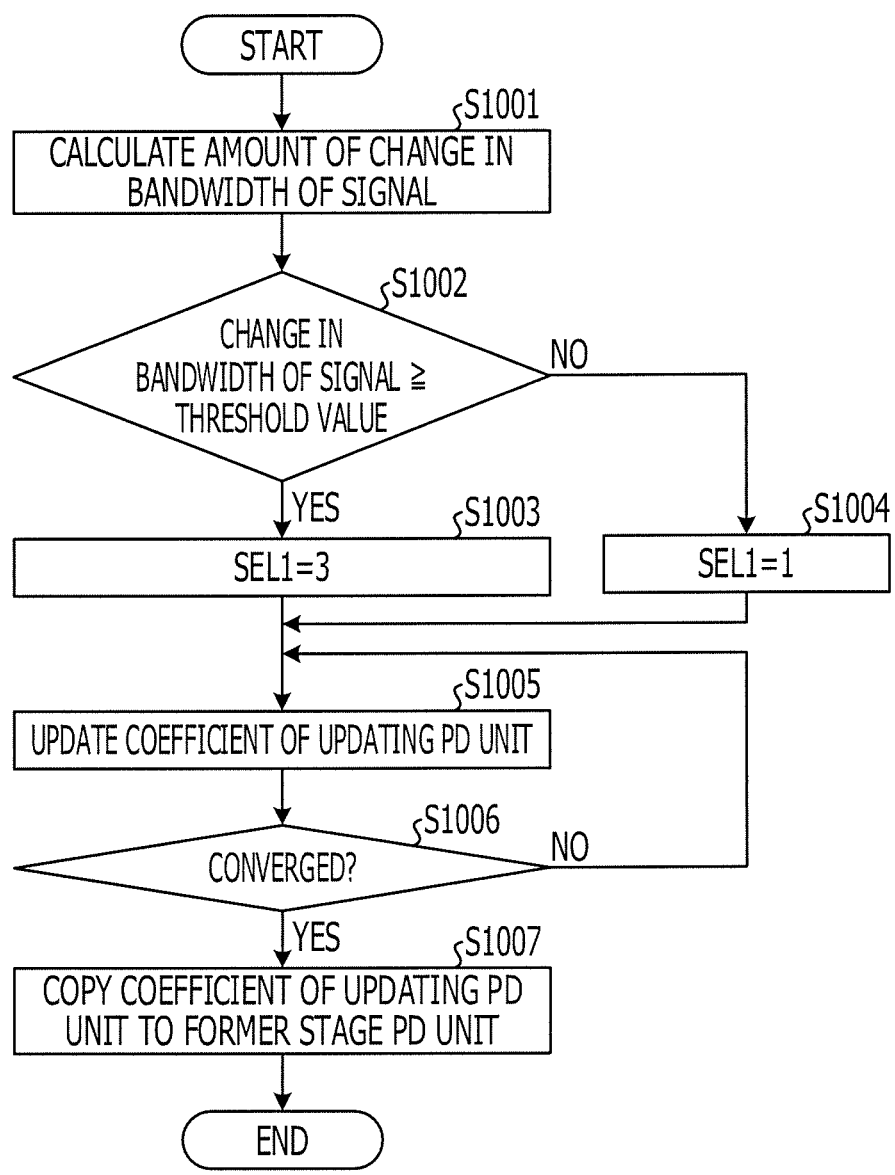
FIG. 10 is a flow chart illustrating an example of a coefficient setting operation for a former stage PD unit according to the second embodiment.

The selector control unit 802 changes the signal to be outputted by the selector 109 based on the bandwidth information outputted from bandwidth determination unit 801 (for example, see FIG. 10).

(Coefficient Setting Operation of Former Stage PD Unit According to Second Embodiment)

FIG. 10 is a flow chart illustrating an example of a coefficient setting operation for a former stage PD unit according to the second embodiment. The amplifying device 100 according to the second embodiment performs the coefficient setting operation of the latter stage PD unit 102 based on, for example, S601 to S605 illustrated in FIG. 6, and then repeats and performs, for example, each of the following operations as the coefficient setting operation of the former stage PD unit 101.

First, the selector control unit 802 calculates the amount of change in the bandwidth of the input signal to the amplifying device 100 based on the bandwidth information outputted from the bandwidth determination unit 801 (S1001). Next, the selector control unit 802 determines whether or not the amount of change in the bandwidth which has been calculated in S1001 is greater than or equal to a threshold value (S1002).

In S1002, when the amount of change in the bandwidth is greater than or equal to the threshold value (Yes in S1002), it is determined that change in nonlinear distortion in the final stage amplifier 106 is large. In this case, the selector control unit 802 sets the input of the selector 109 (SEL1) to "3" (S1003). Thus, the output signal (output signal of the driver stage amplifier 105) to the selector 109 from the ADC 108 is outputted to the coefficient update unit 114, thereby allowing the coefficient setting operation of the former stage PD unit 101 described with reference to FIG. 4 to be performed.

In S1002, when the amount of change in the bandwidth is less than the threshold value (No in S1002), it is determined that change of the nonlinear distortion of the final stage amplifier 106 is small and residual distortion in the output signal of the driver stage amplifier 105 is small, the residual distortion being generated by the update of the coefficient of the former stage PD unit 101. In this case, the selector control unit 802 sets the input of the selector 109 (SEL1) to "1" (S1004). Thus, the output signal (output signal of the former stage PD unit 101) to the selector 109 from the former stage PD unit 101 is outputted to the coefficient update unit 114, thereby allowing the coefficient setting operation of the former stage PD unit 101 described with reference to FIG. 5 to be performed.

Subsequent to S1003 or S1004, the coefficient update unit 114 updates the coefficient of the updating PD unit 113 (S1005). Next, the coefficient update unit 114 determines whether or not the coefficient of the updating PD unit 113 has converged in S1005 (S1006). When the coefficient has not converged (No in S1006), the operational flow of the amplifying device 100 returns to S1005.

In S1006, when the coefficient has converged (Yes in S1006), the control circuit of the amplifying device 100 copies the coefficient of the updating PD unit 113 to the former stage PD unit 101 (S1007), and completes the coefficient setting operation of the former stage PD unit 101.

By performing the above operations, when the change of the nonlinear distortion of the final stage amplifier 106 is large, the coefficient of the former stage PD unit 101 may be set without any influence of the residual distortion in the driver stage amplifier 105. Thus, accuracy of distortion compensation may be improved (a first control state).

When the change of the nonlinear distortion of the final stage amplifier 106 is small and the residual distortion in the output signal of the driver stage amplifier 105 is small, the digital output signal of the former stage PD unit 101 may be used as a reference signal (a second control state). Thus, the coefficient update may be made with increased accuracy.

Thus, in addition to the effect provided by the first embodiment, the amplifying device 100 according to the second embodiment allows the digital output signal of the former stage PD unit 101 to be used as a reference signal when the residual distortion in the output signal of the driver stage amplifier 105 is small. Thus, accuracy of distortion compensation may be improved.

Third Embodiment

Configuration of Amplifying Device According to Third Embodiment

Figure 11:
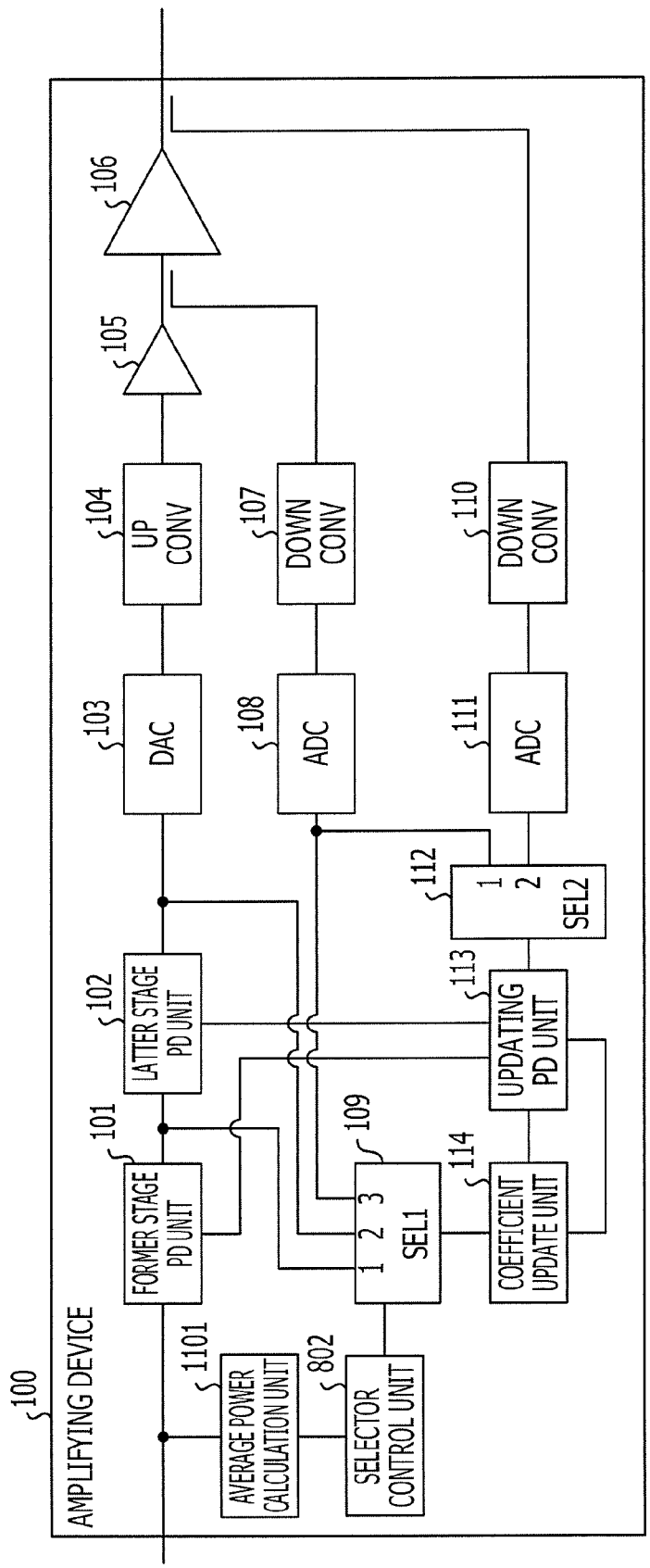
FIG. 11 is a diagram illustrating an example of a configuration of an amplifying device according to a third embodiment.
Figure 12:
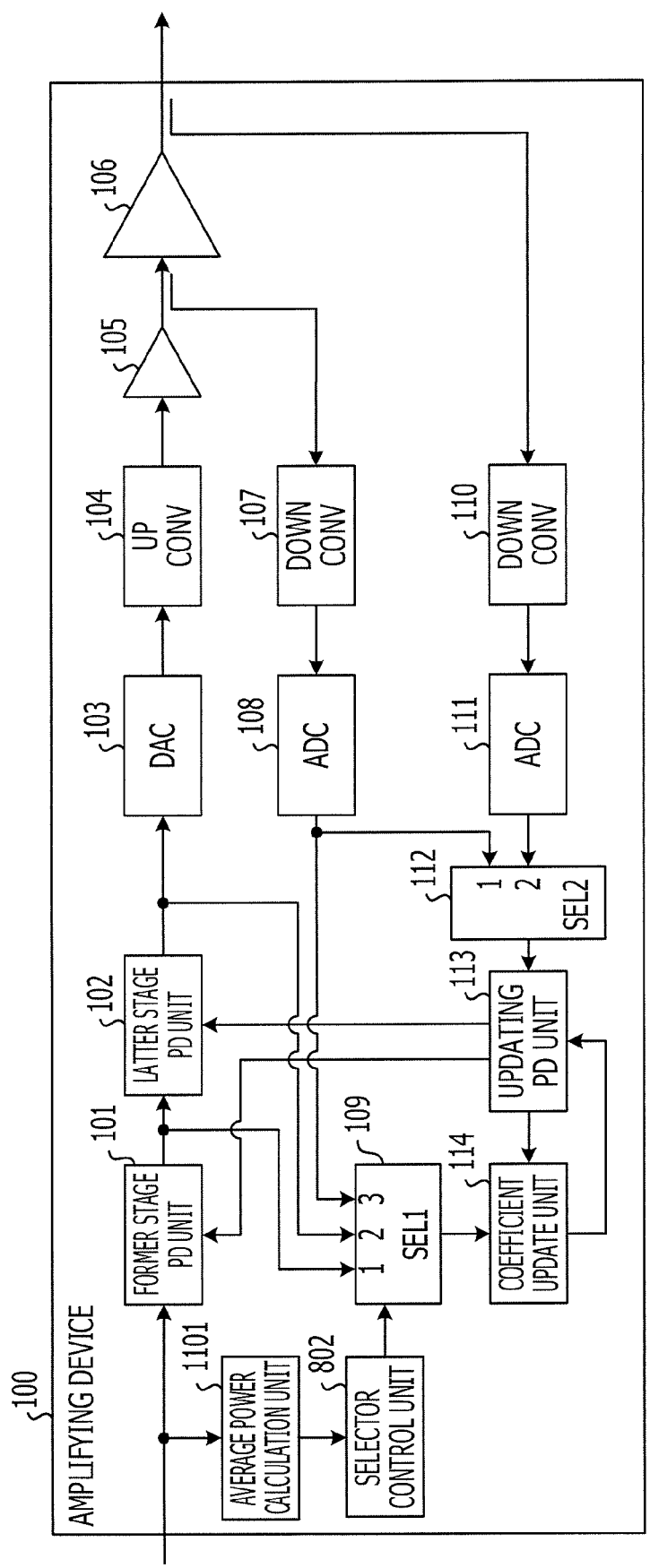
FIG. 12 is a diagram illustrating an example of a signal flow in the amplifying device illustrated in FIG. 11.

FIG. 11 is a diagram illustrating an example of a configuration of an amplifying device according to a third embodiment. FIG. 12 is a diagram illustrating an example of a signal flow in the amplifying device illustrated in FIG. 11. In FIGS. 11 and 12, a portion similar to that illustrated in FIGS. 8 and 9 is labeled with the same symbol, and description is omitted. As illustrated in FIGS. 11 and 12, the amplifying device 100 according to the third embodiment includes an average power calculation unit 1101 instead of the bandwidth determination unit 801 illustrated in FIGS. 8 and 9. The average power calculation unit 1101 may be implemented, for example, by the digital circuit 700 illustrated in FIG. 7.

The average power calculation unit 1101 calculates the average power (for example, the moving average value) of the input signal to the amplifying device 100. The average power calculation unit 1101 then outputs power information to the selector control unit 802, the power information indicating the calculated average power. The selector control unit 802 changes the signal outputted by the selector 109 based on the power information outputted from the average power calculation unit 1101 (for example, see FIG. 13).

(Coefficient Setting Operation of Former Stage PD Unit According to Third Embodiment)

Figure 13:
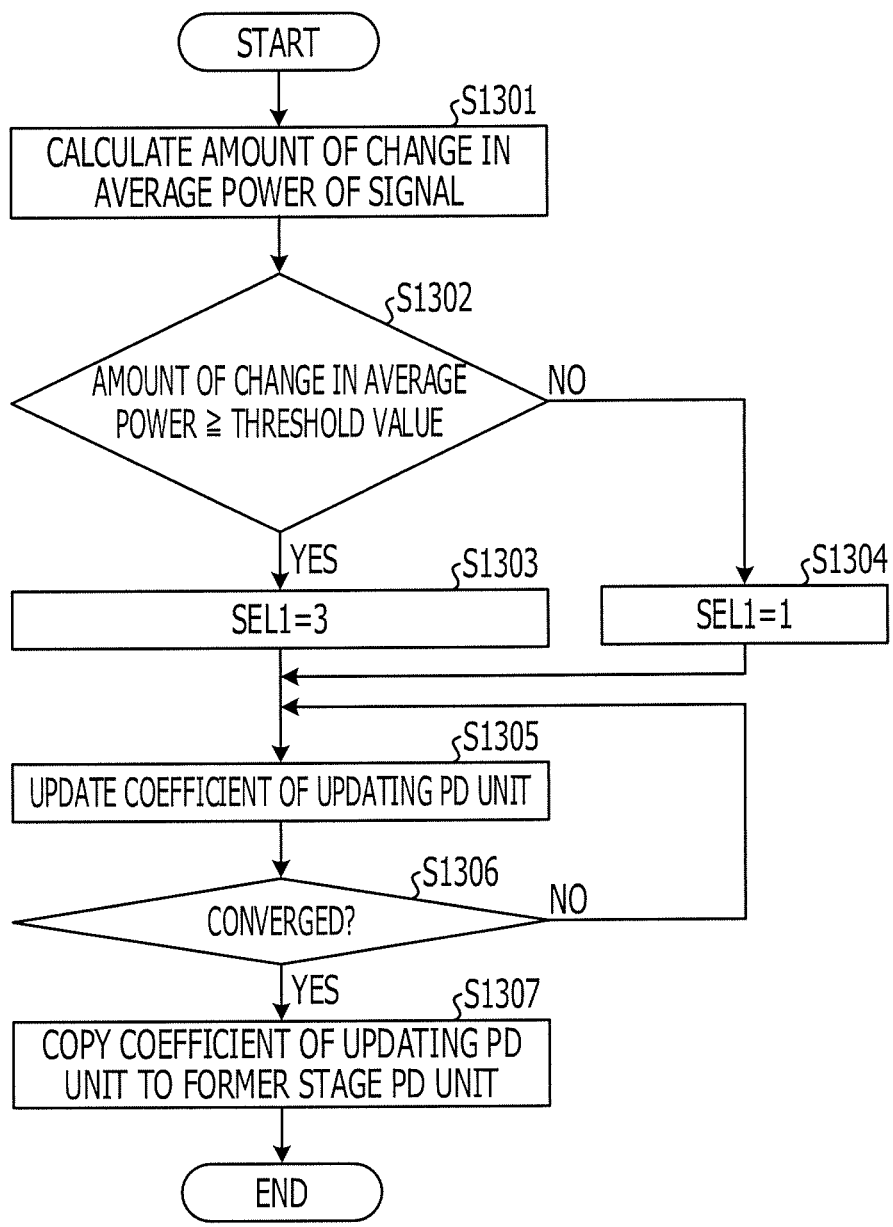
FIG. 13 is a flow chart illustrating an example of a coefficient setting operation for a former stage PD unit according to the third embodiment.

FIG. 13 is a flow chart illustrating an example of a coefficient setting operation for a former stage PD unit according to the third embodiment. The amplifying device 100 according to the third embodiment performs the coefficient setting operation of the latter stage PD unit 102 based on, for example, S601 to S605 illustrated in FIG. 6, and then repeats and performs, for example, each of the following operations as the coefficient setting operation of the former stage PD unit 101.

First, the selector control unit 802 calculates the amount of change in the average power of the signal inputted to the amplifying device 100 based on the power information outputted from the average power calculation unit 1101 (S1301). Next, the selector control unit 802 determines whether or not the amount of change in the average power which has been calculated in S1301 is greater than or equal to a threshold value (S1302).

In S1302, when the amount of change in the average power is greater than or equal to the threshold value (Yes in S1302), it is determined that the change of the nonlinear distortion of the final stage amplifier 106 is large. In this case, the operational flow of the amplifying device 100 proceeds to S1303. When the amount of change in the average power is less than the threshold value (No in S1302), it is determined that the change of the nonlinear distortion of the final stage amplifier 106 is small and the residual distortion in the output signal of the driver stage amplifier 105 is small, the residual distortion being generated by the update of the coefficient of the former stage PD unit 101. In this case, the operational flow of the amplifying device 100 proceeds to S1304. S1303 to S1307 illustrated in FIG. 13 are the same as the S1003 to S1007 illustrated in FIG. 10.

By performing the above operations, when the change of the nonlinear distortion of the final stage amplifier 106 is large, the coefficient of the former stage PD unit 101 may be set without any influence of the residual distortion in the driver stage amplifier 105. Thus, accuracy of distortion compensation may be improved.

When the change of the nonlinear distortion of the final stage amplifier 106 is small and the residual distortion in the output signal of the driver stage amplifier 105 is small, the residual distortion being generated by the update of the coefficient of the former stage PD unit 101, the digital output signal of the former stage PD unit 101 may be used as a reference signal. Thus, the coefficient update may be made with increased accuracy.

Thus, in addition to the effect provided by the first embodiment, the amplifying device 100 according to the third embodiment allows the digital output signal of the former stage PD unit 101 to be used as a reference signal when the residual distortion in the output signal of the driver stage amplifier 105 is small. Thus, accuracy of distortion compensation may be improved.

Fourth Embodiment

Configuration of Amplifying Device According to Fourth Embodiment

Figure 14:
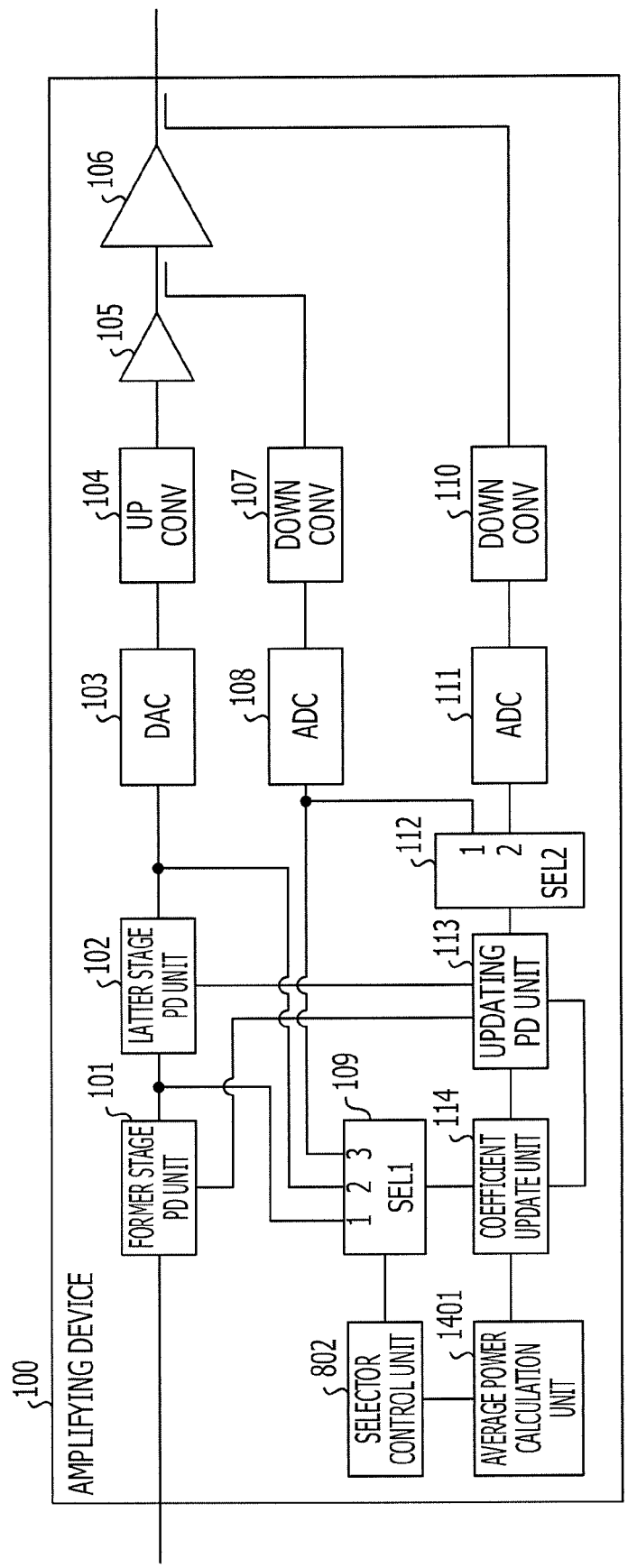
FIG. 14 is a diagram illustrating an example of a configuration of an amplifying device according to a fourth embodiment.
Figure 15:
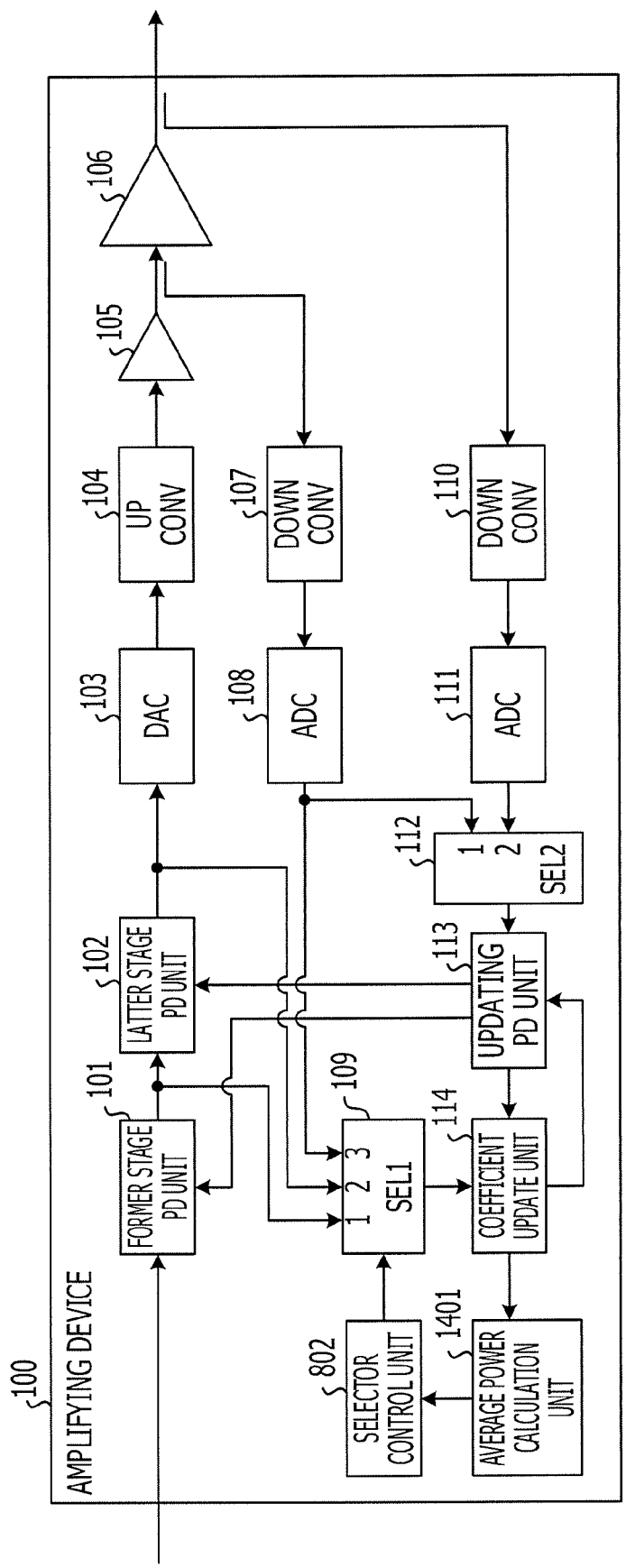
FIG. 15 is a diagram illustrating an example of a signal flow in the amplifying device illustrated in FIG. 14.

FIG. 14 is a diagram illustrating an example of a configuration of an amplifying device according to a fourth embodiment. FIG. 15 is a diagram illustrating an example of a signal flow in the amplifying device illustrated in FIG. 14. In FIGS. 14 and 15, a portion similar to that illustrated in FIGS. 8 and 9 is labeled with the same symbol, and description is omitted. As illustrated in FIGS. 14 and 15, the amplifying device 100 according to the fourth embodiment includes an average power calculation unit 1401 instead of the bandwidth determination unit 801 illustrated in FIGS. 8 and 9. The average power calculation unit 1401 may be implemented, for example, by the digital circuit 700 illustrated in FIG. 7.

The coefficient update unit 114 outputs an error signal to the average power calculation unit 1401, the error signal indicating an error between the reference signal outputted from the selector 109 and the signal outputted from the updating PD unit 113. The average power calculation unit 1401 calculates the average power of the error signal which is outputted from the coefficient update unit 114. The average power calculation unit 1401 then outputs power information to the selector control unit 802, the power information indicating the calculated average power.

Figure 16:
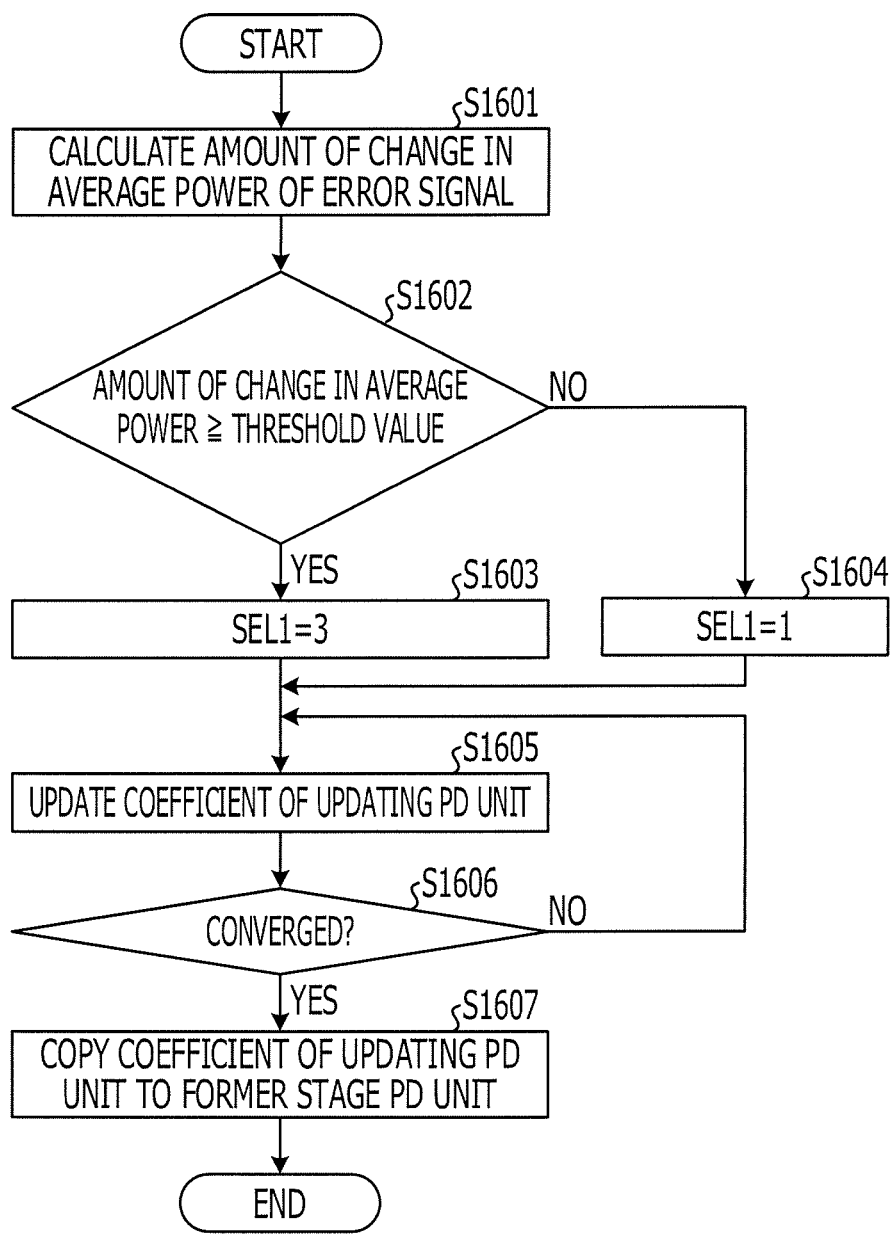
FIG. 16 is a flow chart illustrating an example of a coefficient setting operation for a former stage PD unit according to the fourth embodiment.

The selector control unit 802 changes the signal outputted by the selector 109 based on the power information outputted from the average power calculation unit 1401 (for example, see FIG. 16).

(Coefficient Setting Operation of Former Stage PD Unit According to Fourth Embodiment)

FIG. 16 is a flow chart illustrating an example of a coefficient setting operation for a former stage PD unit according to the fourth embodiment. The amplifying device 100 according to the fourth embodiment performs the coefficient setting operation of the latter stage PD unit 102 based on, for example, S601 to S605 illustrated in FIG. 6, and then repeats and performs, for example, each of the following operations as the coefficient setting operation of the former stage PD unit 101.

First, the selector control unit 802 calculates the amount of change in the average power of the error signal outputted from the coefficient update unit 11 based on the power information outputted from the average power calculation unit 1401 (S1601). Next, the selector control unit 802 determines whether or not the amount of change in the average power which has been calculated in S1601 is greater than or equal to a threshold value (S1602).

In S1602, when the amount of change in the average power is greater than or equal to the threshold value (Yes in S1602), it is determined that the change of the nonlinear distortion of the final stage amplifier 106 is large. In this case, the operational flow of the amplifying device 100 proceeds to S1603. When the amount of change in the average power is less than the threshold value (No in S1602), it is determined that the change of the nonlinear distortion of the final stage amplifier 106 is small and the residual distortion in the output signal of the driver stage amplifier 105 is small, the residual distortion being generated by the update of the coefficient of the former stage PD unit 101. In this case, the operational flow of the amplifying device 100 proceeds to S1604. S1603 to S1607 illustrated in FIG. 16 are the same as the S1003 to S1007 illustrated in FIG. 10.

By performing the above operations, when the change of the nonlinear distortion of the final stage amplifier 106 is large, the coefficient of the former stage PD unit 101 may be set without any influence of the residual distortion in the driver stage amplifier 105. Thus, accuracy of distortion compensation may be improved.

When the change of the nonlinear distortion of the final stage amplifier 106 is small and the residual distortion in the output signal of the driver stage amplifier 105 is small, the digital output signal of the former stage PD unit 101 may be used as a reference signal, the residual distortion being generated by the update of the coefficient of the former stage PD unit 101. Thus, the coefficient update may be made with increased accuracy.

Thus, in addition to the effect provided by the first embodiment, the amplifying device 100 according to the fourth embodiment allows the digital output signal of the former stage PD unit 101 to be used as a reference signal when the residual distortion in the output signal of the driver stage amplifier 105 is small. Thus, accuracy of distortion compensation may be improved.

(CCDF of Input Amplitude of Latter Stage PD Unit Before and after Update of Former Stage PD Unit)

Figure 17:
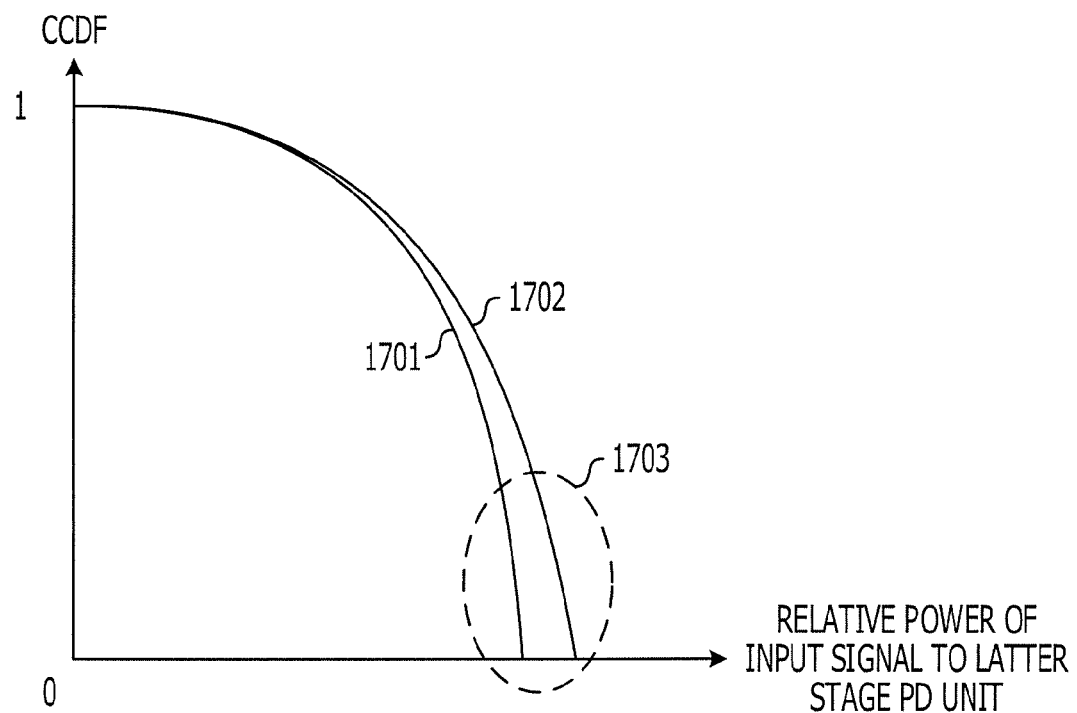
FIG. 17 is a graph illustrating an example of a CCDF of an input amplitude of the latter stage PD unit before and after the former stage PD unit is updated.

FIG. 17 is a diagram illustrating an example of a CCDF of an input amplitude of a latter stage PD unit before and after the former stage PD unit is updated. In FIG. 17, the horizontal axis indicates a relative power of the input signal of the latter stage PD unit 102, and the vertical axis indicates a complementary cumulative distribution function (CCDF).

A CCDF characteristic 1701 indicates the CCDF before the coefficient of the former stage PD unit 101 is updated. A CCDF characteristic 1702 indicates the CCDF after the coefficient of the former stage PD unit 101 is updated. When the nonlinear distortion of the final stage amplifier 106 varies with a change of a transmission signal, CCDFs in a signal peak area 1703 before and after the update of the former stage PD unit 101 are different from each other as indicated by the CCDF characteristics 1701 and 1702. That is to say, the signal characteristics of the input to the latter stage PD unit 102 before and after the update of the former stage PD unit 101 are different from each.

The latter stage PD unit 102 has a coefficient which cancels the distortion of the driver stage amplifier 105 before the coefficient of the former stage PD unit 101 is updated. For this reason, when the signal characteristic of the input to the latter stage PD unit 102 changes by the update of the coefficient of the former stage PD unit 101, the distortion of the driver stage amplifier 105 may not be completely cancelled, and thus the distortion remains in the output signal of the driver stage amplifier 105. Therefore, the distortion in the final stage amplifier having received distorted signals becomes complicated.

Thus, with the conventional configuration in which the coefficient of the former stage PD unit is updated based on the difference between the output signals of the former stage PD unit and the final stage amplifier, when the distortion of driver stage amplifier is not appropriately compensated by the latter stage PD unit, compensation in the former stage PD unit becomes difficult because of the influence of the residual distortion in the input signal of the final stage amplifier. An example of the above situation may occur when the average power or the signal bandwidth of the input signal significantly changes over time. That is, a change in the input signal causes especially the distortion characteristic of the final stage amplifier to change, thus the characteristic of the input signal to the latter stage PD unit significantly changes before and after the update of the former stage PD unit.

On the other hand, with the amplifying device 100 according to the above-described embodiments, the coefficient of the former stage PD unit 101 may be updated based on the difference between the input signal and the output signal of the final stage amplifier 106. Thus, the coefficient of the former stage PD unit 101 may be set without any influence of the residual distortion in the driver stage amplifier 105, and distortion in the final stage amplifier 106 may be compensated with high accuracy. Consequently, for example, reduction of convergence speed of the coefficient of the former stage PD unit 101 is controlled, and even when the characteristic of input signal significantly changes, stable operation may be achieved.

In addition, in the amplifying device 100, when the residual distortion of the driver stage amplifier 105 is small, by adopting a configuration that allows the digital output signal of the former stage PD unit 101 to be used as a reference signal, highly accurate compensation of distortion may be achieved.

However, it is also possible to exclude the configuration which allows the output signal of the former stage PD unit 101 to be used as a reference signal. For example, in the selector 109 according to the first embodiment described above, an input path for the output signal of the former stage PD unit 101 may be excluded. Also in this case, the coefficient of the former stage PD unit 101 may be updated based on the difference between the input signal and the output signal of the final stage amplifier 106, thus highly accurate compensation of the distortion in the final stage amplifier 106 may be achieved.

As described above, with the amplifying device, the distortion compensating device, and the distortion compensation method, accuracy of distortion compensation may be improved.

In this application, for example, "connected to" is able to be replaced with "coupled to". Moreover, for example, when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. So do "connecting to", "coupling to", "connection to", "coupling to" and so on.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An amplifying device comprising:
   a first amplifier configured to generate a first output signal by amplifying an input signal;
   a second amplifier configured to generate a second output signal by amplifying the first output signal; and
   a processor configured to:
   perform first compensation by compensating distortions in the second amplifier based on a difference between the first output signal and the second output signal; and
   perform second compensation by compensating distortions in the first amplifier based on a difference between the input signal and the first output signal.

2. The amplifying device according to claim 1, wherein the processor is further configured to perform the first compensation by compensating distortions in the second amplifier based on a difference between the input signal and the second output signal.

3. The amplifying device according to claim 2, wherein the processor is further configured to detect a specified change in the input signal, and to switch between the first compensation and the second compensation based on the specified change.

4. The amplifying device according to claim 3, wherein the specified change comprises a change in a frequency bandwidth of the input signal.

5. The amplifying device according to claim 3, wherein the specified change comprises a change in a power value of the input signal.

6. An amplifying method comprising:
   generating a first output signal by amplifying an input signal by a first amplifier;
   generating a second output signal by amplifying the first output signal by a second amplifier;
   performing first compensation by compensating distortions in the second amplifier based on a difference between the first output signal and the second output signal; and
   performing second compensation by compensating distortions in the first amplifier based on the input signal and the first output signal.

7. The amplifying method according to claim 6 further comprising:
   performing the first compensation by compensating a distortion for the second amplifier in accordance with the input signal and the second output signal; and
   switching between the first compensation and the second compensation.

8. The amplifying method according to claim 7 further, comprising:
   detecting a specified change in the input signal, wherein the switching switches between the first compensation and the second compensation based on the specified change.

9. The amplifying method according to claim 8, wherein the specified change comprises a change in a frequency bandwidth of the input signal.

10. The amplifying method according to claim 8, wherein the specified change comprises a change in a power of the input signal.

11. An amplifying device comprising:
    a first pre-distortion circuit configured to receive an input signal and to output a first output signal, the first pre-distortion circuit being controlled by a first parameter;
    a second pre-distortion circuit configured to receive the first output signal and to output a second output signal, the second pre-distortion circuit being controlled by a second parameter;
    a first amplifier configured to receive the second output signal and to output a third output signal by amplifying the second output signal;
    a second amplifier configured to receive the third output signal and to output a fourth output signal by amplifying the third output signal; and
    third pre-distortion circuit coupled to the first pre-distortion circuit, the third pre-distortion circuit being controlled by a third parameter, wherein:
    the third parameter is set based on the third output signal and the fourth output signal, and
    after the third parameter is set, the first parameter is set based on the third parameter.

12. The amplifying device according to claim 11, wherein, before the third parameter is set based on the third output signal and the fourth output signal, the third parameter is set based on the second output signal and the third output signal,
    after the third parameter is set based on the second output signal and the third output signal, the second parameter is set based on the third parameter.

13. The amplifying device according to claim 11, wherein the third parameter is set based on a difference between the third output signal and the fourth output signal.

14. The amplifying device according to claim 12, wherein the third parameter is set based on a difference between the second output signal and the third output signal.

15. An amplifying apparatus comprising:
    a first pre-distortion circuit configured to receive an input signal and to output a first output signal, the first pre-distortion circuit being controlled by a first parameter;
    a second pre-distortion circuit configured to receive the first output signal and to output a second output signal, the second pre-distortion circuit being controlled by a second parameter;
    a first amplifier configured to receive the second output signal and to output a third output signal by amplifying the second output signal;

a second amplifier configured to receive the third output signal and to output a fourth output signal by amplifying the third output signal; and a distortion compensation device configured to:

select one of the first output signal, the second output signal, and the third output signal, as a reference signal;

select one of the third output signal and the fourth output signal, as a feedback signal; and iteratively determine the first parameter or the second parameter based on a difference between the reference signal and the feedback signal.

16. The amplifying apparatus according to claim 15, wherein the distortion compensation device is further configured to:

select the second output signal as the reference signal;

select the third output signal as the feedback signal; and iteratively determine the second parameter based on the difference between the reference signal and the feedback signal.

17. The amplifying apparatus according to claim 15, wherein the distortion compensation device is further configured to:

select the third output signal as the reference signal;

select the fourth output signal as the feedback signal; and iteratively determine the first parameter based on the difference between the reference signal and the feedback signal.

* * * * *